(12) United States Patent
Ausserlechner et al.

(10) Patent No.: US 11,391,558 B2
(45) Date of Patent: Jul. 19, 2022

(54) INTEGRATED HALL SENSOR DEVICE AND METHOD FOR MEASURING A MAGNETIC FIELD BY MEANS OF AN INTEGRATED HALL SENSOR DEVICE

(71) Applicant: Infineon Technologies AG, Neubiberg (DE)

(72) Inventors: Udo Ausserlechner, Villach (AT); Richard Heinz, Munich (DE); Benjamin Kollmitzer, Pörtschach (AT); Armin Satz, Villach (AT)

(73) Assignee: Infineon Technologies AG

( * ) Notice: Subject to any disclaimer, the term of this patent is extended or adjusted under 35 U.S.C. 154(b) by 238 days.

(21) Appl. No.: 16/816,771

(22) Filed: Mar. 12, 2020

(65) Prior Publication Data
US 2020/0292295 A1   Sep. 17, 2020

(30) Foreign Application Priority Data
Mar. 15, 2019   (DE) .......................... 102019203580.9

(51) Int. Cl.
*G01B 7/30* (2006.01)
*G01R 33/07* (2006.01)
(Continued)

(52) U.S. Cl.
CPC ............... *G01B 7/30* (2013.01); *G01K 13/00* (2013.01); *G01L 5/00* (2013.01); *G01R 33/077* (2013.01)

(58) Field of Classification Search
CPC . G01B 7/30; G01K 13/00; G01L 5/00; G01R 33/077
See application file for complete search history.

(56) References Cited

U.S. PATENT DOCUMENTS

| | | | |
|---|---|---|---|
| 8,723,515 B2 * | 5/2014 | Motz | G01R 33/0029 324/251 |
| 9,606,189 B2 | 3/2017 | Ausserlechner | |

(Continued)

FOREIGN PATENT DOCUMENTS

DE    202014004425 U1    9/2014

OTHER PUBLICATIONS

Mario Motz et al, "Electrical Compensation of Mechanical Stress Drift in Precision Analog Circuits". Springer International Publishing Switzerland, Wideband Continuous-time, 2017, Chapter 16, pp. 297-326, [Online] URL: <https://www.springer.com/us/book/9783319416694#aboutAuthors>.

(Continued)

*Primary Examiner* — Reena Aurora
(74) *Attorney, Agent, or Firm* — Design IP

(57) ABSTRACT

An integrated Hall sensor device for measuring a magnetic field is provided. The integrated Hall sensor device includes: a semiconductor chip; a first Hall sensor for generating a first magnetic field measurement signal dependent on a first component; a second Hall sensor for generating a second magnetic field measurement signal dependent on a second component of the magnetic field; a first stress sensor for generating a shear stress measurement signal dependent on mechanical stresses in the semiconductor chip; and an evaluation device for determining one or more properties of the magnetic field depending on the first magnetic field measurement signal, the second magnetic field measurement signal. and the first shear stress measurement signal.

19 Claims, 10 Drawing Sheets

(51) Int. Cl.
  *G01K 13/00* (2021.01)
  *G01L 5/00* (2006.01)

(56) References Cited

U.S. PATENT DOCUMENTS 10,333,463 B2 * 6/2019 Motz ............... H03K 3/0231
2018/0017636 A1 1/2018 Motz et al.

OTHER PUBLICATIONS

Kirill Poletkin et al, "Magnetic Sensors and Devices, Technologies and Applications". CRC Press, 2018, Chapter 7, pp. 201-203, [Online] URL: <https://www.crcpress.com/Magnetic-Sensors-and-Devices-Technologies-and-Applications/Francis-Poletkin/p/book/9781498710978>.
Enrico Schurig, "Highly Sensitive Vertical Hall Sensors in CMOS Technology". Hartung-Gorre Verlag Konstanz, 2005, vol. 17, Series in Microsystems, [Online] URL: <http://www.hartung-gorre.de/ms17.htm>.
Ausserlechner U., "Hall Effect Devices with Three Terminals: Their Magnetic Sensitivity and Offset Cancellation Scheme," Journal of Sensors, vol. 2016, Article ID 5625607, 2016,17 pages. [Online] URL: <https://www.hindawi.com/journals/js/2016/5625607>.
Ausserlechner U., "An Analytical Theory of Piezoresistive Effects in Hall Plates with Large Contacts", Advances in Condensed Matter Physics, vol. 2018, Article ID 7812743, 2018, 25 pages. [Online] URL: <https://doi.org/10.1155/2018/7812743>.
Ausserlechner, U., "An Analytical Theory of the Signal-to-Noise Ratio of Hall Plates with Four Contacts and a Single Mirror Symmetry", Journal of Applied Mathematics and Physics, vol. 6, No. 10, 2018, pp. 2032-2066. [Online] URL: <https://doi.org/10.4236/jamp.2018.610174>.

* cited by examiner

INTEGRATED HALL SENSOR DEVICE AND METHOD FOR MEASURING A MAGNETIC FIELD BY MEANS OF AN INTEGRATED HALL SENSOR DEVICE

FIELD

Exemplary embodiments relate to an integrated Hall sensor device for measuring a magnetic field. Specifically, exemplary embodiments relate to an integrated Hall sensor device based on Hall sensors each having a vertical Hall element.

BACKGROUND

The magnetic field measurement signal of a vertical Hall sensor is dependent not only on the value of the respective magnetic field but also on the angular position of the respective magnetic field relative to the vertical Hall sensor. If the vertical Hall element of the Hall sensor is exposed to a uniformly rotating magnetic field, then the magnetic field measurement signal has a sinusoidal profile along a time axis, but an undesired phase difference can occur between the real phase angle of the respective magnetic field and the phase angle of the magnetic field measurement signal. This can result in undesired measurement inaccuracies both when determining the value of the magnetic field and when determining an angular position of the magnetic field.

SUMMARY

What is disclosed is an integrated Hall sensor device for measuring a magnetic field including:

a semiconductor chip oriented parallel to an xy-plane spanned by an x-axis and by a y-axis of a three-dimensional cartesian coordinate system;

a first Hall sensor for generating a first magnetic field measurement signal, said first Hall sensor having a first vertical Hall element configured on the semiconductor chip in such a way that, if said first vertical Hall element is mechanically stress-free, the first magnetic field measurement signal is dependent on a component of the magnetic field acting parallel to the x-axis and is independent of a component of the magnetic field acting parallel to the y-axis;

a second Hall sensor for generating a second magnetic field measurement signal, said second Hall sensor having a second vertical Hall element configured on the semiconductor chip in such a way that, if said second vertical Hall element is mechanically stress-free, the second magnetic field measurement signal is dependent on the component of the magnetic field acting parallel to the y-axis and is independent of the component of the magnetic field acting parallel to the x-axis;

a first stress sensor for measuring mechanical stresses in the semiconductor chip, wherein the first stress sensor is configured for generating a first shear stress measurement signal corresponding to a first shear stress acting on the first vertical Hall element, said first shear stress acting in a plane perpendicular to the x-axis parallel to the y-axis; and an evaluation device for determining one or more properties of the magnetic field depending on the first magnetic field measurement signal, depending on the second magnetic field measurement signal and depending on the first shear stress measurement signal.

The cartesian coordinate system can be left-handed or right-handed.

An integrated Hall sensor device is a Hall sensor device in which at least one Hall element and at least part of the evaluation electronics for evaluating signals of the Hall element are arranged on a lamella composed of a semiconductor material, said lamella usually being a few millimeters in size. The lamella is also called a semiconductor chip. The Hall element and the evaluation electronics arranged on the semiconductor chip form a Hall sensor in this case.

Hall elements consist of thin crystalline doped semiconductor layers having a plurality of electrodes. In this case, a current is fed by some of the electrodes, while a Hall voltage is tapped off by other electrodes. If such a Hall sensor is permeated by a magnetic field, it supplies an output voltage which is proportional to the signed magnitude of the vector product of magnetic flux density and current. The cause is the Lorentz force on the moving majority charge carriers in the Hall element.

In the case of vertical Hall sensors, the magnitude flux density is measured parallel to the surface of the semiconductor chip. Vertical Hall sensors are not necessarily constructed as thin layers.

Vertical Hall sensors can consist of a single doped well, or of a plurality of wells connected to one another by means of contacts and conductor tracks. In this case, a well can have 3, 4, 5 or more contacts. In this case, in the layout plan view, a well usually has an elongate rectangular shape, but can also have a compact, almost square shape or a ring-shaped shape. The present disclosure relates primarily to systems including vertical Hall sensors, the wells of which are embedded in monocrystalline semiconductor material, in particular in silicon, in particular in n-doped silicon (doped with As or P), in particular having dopant concentrations of between $10^{\wedge}15/cm^3$ and $5*10^{\wedge}17/cm^3$. The wells are usually electrically insulated from the rest of the chip by reverse-biased pn junctions or nonconductive dielectric layers (shallow or deep trench isolation) or by SOI technology (Silicon On Insulator). The depth of the wells is usually between 15 µm and 2 µm.

The first Hall sensor is arranged on the semiconductor chip such that its first magnetic field measurement signal detects exclusively the x-component of the magnetic field, but not the y-component of the magnetic field, provided that its first Hall element is mechanically stress-free. In this case, this feature should not be understood in the mathematical sense, but rather in the technical sense. In this regard, it is known to the person skilled in the art that, particularly in the case of relatively high magnetic flux densities, an albeit small dependence on the y-component of the magnetic field is unavoidable for technical reasons. In the context of the proposed integrated Hall sensor device, it is sufficient if the first magnetic field measurement signal is independent of the y-component of the magnetic field under the condition $\mu h \times abs(B) < 0.1$, wherein µh is the Hall mobility in the unit $m^2/V/s$, and wherein abs(B) is the absolute value of the magnetic flux density in the unit T. This condition corresponds to a Hall angle of less than 5.7°.

The second Hall sensor is arranged on the semiconductor chip such that its second magnetic field measurement signal detects exclusively the y-component of the magnetic field, but not the x-component of the magnetic field, provided that its second Hall element is mechanically stress-free. In this case, analogously to above, this feature should not be understood in the mathematical sense, but rather in the technical sense. In this regard, it is known to the person skilled in the art that, particularly in the case of relatively high magnetic flux densities, an albeit small dependence on the x-component of the magnetic field is unavoidable for technical reasons. In the context of the proposed integrated Hall sensor device, it is sufficient if the second magnetic field measurement signal is independent of the x-component of the magnetic field under the condition $\mu h \times abs(B) < 0.1$, wherein $\mu h$ is the Hall mobility in the unit $m^2/V/s$, and wherein $abs(B)$ is the absolute value of the magnetic flux density in the unit T.

The two vertical Hall elements are mechanically stress-free if they are not mechanically stressed by external mechanical forces.

The first stress sensor can be a conventional stress sensor.

The evaluation device is configured for determining one or more properties of the magnetic field depending on the first magnetic field measurement signal, depending on the second magnetic field measurement signal and depending on the first shear stress measurement signal. This can generally be expressed mathematically by the equation:

$$E = f(Voutx, Vouty, VsigmaXY) \quad (1),$$

wherein E is the respective property of the magnetic field, wherein Voutx is the value of the first magnetic field measurement signal, wherein Vouty is the value of the second magnetic field measurement signal, and wherein VsigmaXY is the value of the first shear stress measurement signal. A suitable function f can be ascertained for example by experiments or computational simulations.

The integrated Hall sensor device described is based on the insight that measurement inaccuracies in devices of the generic type can be generated or amplified by variable mechanical stresses occurring during the operation of the Hall sensor device. A further insight here is that precisely first shear stresses acting on the first vertical Hall element and acting in a plane perpendicular to the x-axis parallel to the y-axis cause a substantial proportion of the measurement inaccuracies generated or amplified by variable mechanical stresses occurring during the operation of the Hall sensor device.

In the case of the integrated Hall sensor device described, such measurement inaccuracies are compensated for, that is to say avoided or at least significantly reduced, such that the respective sought property of the magnetic field can be measured more accurately.

The integrated Hall sensor device described can be used for example in a magnetic angle sensor or in a Gaussmeter.

In exemplary embodiments, the one or more properties of the magnetic field include a value of the component of the magnetic field acting in the x-direction. Said value is composed of an absolute value and a sign of the component of the magnetic field acting in the x-direction. This can be expressed mathematically by the equation:

$$Bx = f_1(Voutx, Vouty, VsigmaXY) \quad (2),$$

wherein Bx is the value of the component of the magnetic field acting in the x-direction, wherein Voutx is the value of the first magnetic field measurement signal, wherein Vouty is the value of the second magnetic field measurement signal, and wherein VsigmaXY is the value of the first shear stress measurement signal. A suitable function $f_1$ can be ascertained for example by experiments or computational simulations.

In exemplary embodiments, the one or more properties of the magnetic field include a value of the component of the magnetic field acting in the y-direction. Said value is composed of an absolute value and a sign of the component of the magnetic field acting in the y-direction. This can be expressed mathematically by the equation:

$$By = f_2(Voutx, Vouty, VsigmaXY) \quad (3),$$

wherein By is the value of the component of the magnetic field acting in the y-direction, wherein Voutx is the value of the first magnetic field measurement signal, wherein Vouty is the value of the second magnetic field measurement signal, and wherein VsigmaXY is the value of the first shear stress measurement signal. A suitable function $f_2$ can be ascertained for example by experiments or computational simulations.

In exemplary embodiments, the one or more properties of the magnetic field include an angular position of the magnetic field in the xy-plane. This can be expressed mathematical by the equation:

$$\varphi = f_3(Voutx, Vouty, VsigmaXY) \quad (4),$$

wherein $\varphi$ is the angular position of the magnetic field in the xy-plane, wherein Voutx is the value of the first magnetic field measurement signal, wherein Vouty is the value of the second magnetic field measurement signal, and wherein VsigmaXY is the value of the first shear stress measurement signal. A suitable function $f_3$ can be ascertained for example by experiments or computational simulations.

If the value of the component of the magnetic field acting in the x-direction and the value of the component of the magnetic field acting in the y-direction have already been ascertained, then the calculation of the angular position can be ascertained in accordance with the following equation:

$$\varphi = f_3(Voutx, Vouty, VsigmaXY) = \arctan(By/Bx) \quad (5).$$

In exemplary embodiments, the integrated Hall sensor device includes a second stress sensor for generating a second shear stress measurement signal corresponding to a second shear stress acting on the second vertical Hall element, said second shear stress acting in a plane perpendicular to the x-axis parallel to the y-axis, wherein the evaluation device is configured for determining the one or more properties of the magnetic field depending on the first magnetic field measurement signal, depending on the second magnetic field measurement signal, depending on the first shear stress measurement signal and depending on the second shear stress measurement signal.

Taking account of the second shear stress measurement signal can be expressed mathematically generally by the equation:

$$E = f_4(Voutx, Vouty, VsigmaXY, VsigmaXY2) \quad (6),$$

wherein E is the respective property of the magnetic field, wherein Voutx is the value of the first magnetic field measurement signal, wherein Vouty is the value of the second magnetic field measurement signal, wherein VsigmaXY is the value of the first shear stress measurement signal, and wherein VsigmaXY2 is the value of the second shear stress measurement signal. A suitable function $f_4$ can be ascertained for example by experiments or computational simulations.

The second stress sensor can be constructed analogously to the first stress sensor described above. Exemplary embodiments of this type can increase the measurement accuracy further, particularly if the first vertical Hall element and the second vertical Hall element are exposed to significantly different shear stresses. This can be the case, for example, if the semiconductor chip is greatly structured or if the first vertical Hall element and the second vertical Hall element are arranged far away from one another.

In exemplary embodiments, the evaluation device is configured for determining the value of the component of the magnetic field acting in the x-direction on the basis of a first linear combination of the first magnetic field measurement signal and the second magnetic field measurement signal, wherein the evaluation device is configured for determining a first coefficient of the first linear combination and/or a second coefficient of the first linear combination depending on the first shear stress measurement signal.

The first linear combination has the form:

$$Bx = a \times Voutx + b \times Vouty \quad (7),$$

wherein Voutx is the value of the first magnetic field measurement signal, wherein Vouty is the value of the second magnetic field measurement signal, wherein a is the first coefficient and b is the second coefficient.

In this case, it holds true that:

$$a = f_5(VsigmaXY) \quad (8),$$

wherein a is the first coefficient, and wherein VsigmaXY is the value of the first shear stress measurement signal; and/or $$b = f_6(VsigmaXY) \quad (9),$$

wherein b is the second coefficient, and wherein VsigmaXY is the value of the first shear stress measurement signal.

Suitable functions $f_5$ and $f_6$ can be ascertained for example by experiments or computational simulations.

In this case, it holds true in principle that:

$$Voutx = Sxx \times Bx + Sxy \times By \quad (10),$$

and $$Vouty = Syy \times By + Syx \times Bx \quad (11),$$

wherein Voutx is the value of the first magnetic field measurement signal, wherein Vouty is the value of the second magnetic field measurement signal, wherein Sxx is the magnetic sensitivity of the first Hall sensor, wherein Sxy is the magnetic cross-sensitivity of the first Hall sensor, wherein Syy is the magnetic sensitivity of the second Hall sensor, wherein Syx is the magnetic cross-sensitivity of the second Hall sensor.

It follows from (10) and (11) that:

$$Bx = Syy/(-Sxy \times Syx + Sxx \times Syy) \times Voutx + -Sxy/(-Sxy \times Syx + Sxx \times Syy) \times Vouty, \quad (12),$$

and in conjunction with (7) this results in $$a = Syy/(-Sxy \times Syz + Sxx \times Syy) \quad (13),$$

and $$b = -Sxy/(-Sxy \times Syz + Sxx \times Syy) \quad (14).$$

In this case, it holds true that both the magnetic cross-sensitivity Sxy of the first Hall sensor and the magnetic cross-sensitivity Syx of the second Hall sensor are greatly dependent on the value VsigmaXY of the first shear stress measurement signal.

The influence of the value VsigmaXY of the first shear stress measurement signal on the cross-sensitivities:

$$Sxy = f_7(VsigmaXY) \quad (15),$$

and $$Syx = f_8(VsigmaXY) \quad (16)$$

can be compensated for by means of suitable functions $f_7$ and $f_8$. The functions can be ascertained for example by experiments or computational simulations. In many cases, both the magnetic cross-sensitivity Sxy of the first Hall sensor and the magnetic cross-sensitivity Syx of the second Hall sensor are proportional to the value VsigmaXY of the first shear stress measurement signal. To a good approximation the proportionality factor can be a constant factor, which can be ascertained by experiments or simulations.

Furthermore, the magnetic sensitivity of the first Hall sensor Sxx and the magnetic sensitivity of the second Hall sensor Syy can be dependent, albeit to a lesser extent, on the value VsigmaXY of the first shear stress measurement signal.

The influence of the value VsigmaXY of the first shear stress measurement signal on the magnetic sensitivities:

$$Sxx = f_9(VsigmaXY) \quad (17),$$

and $$Syy = f_{10}(VsigmaXY) \quad (18)$$

can be compensated for by means of suitable functions $f_9$ and $f_{10}$ for (17) and (18). The functions can be ascertained for example by experiments or computational simulations.

In exemplary embodiments, the evaluation device is configured for determining the value of the component of the magnetic field acting in the x-direction on the basis of a first linear combination of the first magnetic field measurement signal and the second magnetic field measurement signal, wherein the evaluation device is configured for determining a first coefficient of the first linear combination and/or a second coefficient of the first linear combination depending on the first shear stress measurement signal and the second shear stress measurement signal.

The first linear combination is given here by (7).

In this case, it holds true that:

$$a = f_{11}(VsigmaXY, VsigmaXY2) \quad (19),$$

wherein a is the first coefficient, wherein VsigmaXY is the value of the first shear stress measurement signal, and wherein VsigmaXY2 is the value of the second shear stress measurement signal; and/or $$b = f_{12}(VsigmaXY, VsigmaXY2) \quad (20),$$

wherein b is the second coefficient, wherein VsigmaXY is the value of the first shear stress measurement signal, and wherein VsigmaXY2 is the value of the second shear stress measurement signal.

Suitable functions $f_{11}$ and $f_{12}$ can be ascertained for example by experiments or computational simulations.

Equations (10) to (14) are analogously applicable in this case, too. It holds true here that both the magnetic cross-sensitivity Sxy of the first Hall sensor and the magnetic cross-sensitivity Syx of the second Hall sensor are greatly dependent on the value VsigmaXY of the first shear stress measurement signal and greatly dependent on the value VsigmaXY2 of the second shear stress measurement signal.

The influence of the value VsigmaXY of the first shear stress measurement signal and of the value VsigmaXY2 of the second shear stress measurement signal on the cross-sensitivities:

$$Sxy = f_{13}(VsigmaXY) \quad (21),$$

and $$Syx = f_{14}(VsigmaXY2) \quad (22)$$

can be taken into account by means of suitable functions $f_{13}$ and $f_{14}$. The functions can be ascertained for example by experiments or computational simulations.

In exemplary embodiments, the evaluation device is configured for determining the component of the magnetic field acting in the y-direction on the basis of a second linear combination of the first magnetic field measurement signal and the second magnetic field measurement signal, wherein the evaluation device is configured for determining a first coefficient of the second linear combination and/or a second coefficient of the second linear combination depending on the first shear stress measurement signal.

The second linear combination has the form:

$$By = c \times Voutx + d \times Vouty \quad (23),$$

wherein Voutx is the value of the first magnetic field measurement signal, wherein Vouty is the value of the second magnetic field measurement signal, wherein c is the first coefficient and d is the second coefficient of the second linear combination.

In this case, it holds true that:

$$c = f_{15}(VsigmaXY) \quad (24),$$

wherein c is the first coefficient, and wherein VsigmaXY is the value of the first shear stress measurement signal; and/or $$d = f_{16}(VsigmaXY) \quad (25),$$

wherein d is the second coefficient, and wherein VsigmaXY is the value of the first shear stress measurement signal.

From (10) and (11) it follows that:

$$By = Syx/(-Sxy \times Syx - Sxx \times Syy) \times Voutx + -Sxx/(Sxy \times Syx - Sxx \times Syy) \times Vouty, \quad (26),$$

and in conjunction with (21) this results in:

$$c = Syx/(-Sxy \times Syx - Sxx \times Syy) \quad (27),$$

and $$d = -Sxx/(Sxy \times Syx - Sxx \times Syy) \quad (28).$$

In this case, it holds true that both the magnetic cross-sensitivity Sxy of the first Hall sensor and the magnetic cross-sensitivity Syx of the second Hall sensor are greatly dependent on the value VsigmaXY of the first shear stress measurement signal.

The influence of the value VsigmaXY of the first shear stress measurement signal on the cross-sensitivities Sxy and Syx can be taken into account by means of suitable functions $f_7$ and $f_8$. The functions can be ascertained for example by experiments or computational simulations.

In exemplary embodiments, the evaluation device is configured for determining the value of the component of the magnetic field acting in the y-direction on the basis of a second linear combination of the first magnetic field measurement signal and the second magnetic field measurement signal, wherein the evaluation device is configured for determining a first coefficient of the second linear combination and/or a second coefficient of the second linear combination depending on the first shear stress measurement signal and the second shear stress measurement signal.

In this case, it holds true that:

$$c = f_{17}(VsigmaXY, VsigmaXY2) \quad (29),$$

wherein c is the first coefficient, wherein VsigmaXY is the value of the first shear stress measurement signal, and wherein VsigmaXY2 is the value of the second shear stress measurement signal; and/or $$d = f_{18}(VsigmaXY, VsigmaXY2) \quad (30),$$

wherein d is the second coefficient, wherein VsigmaXY is the value of the first shear stress measurement signal, and wherein VsigmaXY2 is the value of the second shear stress measurement signal.

Equations (26), (27) and (28) are analogously applicable further. In this case, it holds true that both the magnetic cross-sensitivity Sxy of the first Hall sensor and the magnetic cross-sensitivity Syx of the second Hall sensor are greatly dependent on the value VsigmaXY of the first shear stress measurement signal and greatly dependent on the value VsigmaXY2.

The influence of the value VsigmaXY of the first shear stress measurement signal and of the value VsigmaXY2 of the second shear stress measurement signal on the cross-sensitivities:

$$Sxy = f_{19}(VsigmaXY) \quad (31),$$

and $$Syx = f_{20}(VsigmaXY2) \quad (32)$$

can be taken into account by means of suitable functions $f_{19}$ and $f_{20}$. The functions can be ascertained for example by experiments or computational simulations.

In exemplary embodiments, the integrated Hall sensor device has a first normal stress sensor for generating a first normal stress measurement signal corresponding to a first normal stress in the semiconductor chip, said first normal stress acting in the x-direction, wherein the integrated Hall sensor device has a second normal stress sensor for generating a second normal stress measurement signal corresponding to a second normal stress in the semiconductor chip, said second normal stress acting in the y-direction, wherein the evaluation device is configured for determining the first coefficient of the first linear combination and/or the second coefficient of the first linear combination depending on the first normal stress measurement signal and depending on the second normal stress measurement signal.

Taking into account the first normal stress measurement signal and the second normal stress measurement signal can generally be expressed mathematically by the equation:

$$E = f_{21}(Voutx, Vouty, VsigmaXY, VsigmaXX, VsigmaYY) \quad (33),$$

or by the equation:

$$E = f_{22}(Voutx, Vouty, VsigmaXY, VsigmaXY2, VsigmaXX, VsigmaYY) \quad (34),$$

wherein E is the respective property of the magnetic field, wherein Voutx is the value of the first magnetic field measurement signal, wherein Vouty is the value of the second magnetic field measurement signal, wherein VsigmaXY is the value of the first shear stress measurement signal, wherein VsigmaXY2 is the value of the second shear stress measurement signal, wherein VsigmaXX is the value of the first normal stress measurement signal, and wherein VsigmaYY is the value of the second normal stress measurement signal. A suitable function $f_{21}$ or $f_{22}$ can be ascertained for example by experiments or computational simulations.

Equations (10) to (14) are analogously applicable here, too. However, it has been found that both the magnetic cross-sensitivity Sxy of the first Hall sensor and the magnetic cross-sensitivity Syx of the second Hall sensor are not only dependent on the values VsigmaXY and/or VsigmaXY2 of the first and/or second shear stress measurement signal, respectively. In this regard, the magnetic cross-sensitivity Sxy of the first Hall sensor exhibits an albeit weaker dependence on the first normal stress, such that taking account of a value VsigmaXX of the first normal stress measurement signal when ascertaining the magnetic cross-sensitivity Sxy of the first Hall sensor leads to a further improvement in the measurement accuracy. Likewise, the magnetic cross-sensitivity Syx of the second Hall sensor exhibits an albeit weaker dependence on the second normal stress, such that taking account of the value VsigmaYY of the second normal stress measurement signal when ascertaining the magnetic cross-sensitivity Syx of the second Hall sensor leads to a further improvement in the measurement accuracy.

The influence of the values VsigmaXX and VsigmaYY of the first and second normal stress measurement signals on the cross-sensitivity:

$$Sxy=f_{23}(VsigmaXY, VsigmaXX, VsigmaYY) \quad (35)$$

can be taken into account by means of suitable functions $f_{23}$. The functions can be ascertained for example by experiments or computational simulations.

The influence of the values VsigmaXX and VsigmaYY of the first and second normal stress measurement signals on the cross-sensitivity:

$$Syx=f_{24}(VsigmaXY, VsigmaXX, VsigmaYY) \quad (36)$$

and respectively:

$$Syx=f_{25}(VsigmaXY2, VsigmaXX, VsigmaYY) \quad (37)$$

can be taken into account by means of suitable functions $f_{24}$ or $f_{25}$. The functions can be ascertained for example by experiments or computational simulations.

The influence of the values VsigmaXX and VsigmaYY of the first and second normal stress measurement signals on the magnetic sensitivity:

$$Sxx=f_{26}(VsigmaXX, VsigmaYY) \quad (38)$$

can be taken into account by means of suitable functions $f_{26}$. The functions can be ascertained for example by experiments or computational simulations.

The influence of the values VsigmaXX and VsigmaYY of the first and second normal stress measurement signals on the magnetic sensitivity:

$$Syy=f_{27}(VsigmaXX, VsigmaYY) \quad (39)$$

can be taken into account by means of suitable functions $f_{27}$. The functions can be ascertained for example by experiments or computational simulations.

In exemplary embodiments, the integrated Hall sensor device has a first normal stress sensor for generating a first normal stress measurement signal corresponding to a first normal stress in the semiconductor chip, said first normal stress acting in the x-direction, wherein the integrated Hall sensor device has a second normal stress sensor for generating a second normal stress measurement signal corresponding to a second normal stress in the semiconductor chip, said second normal stress acting in the y-direction, wherein the evaluation device is configured for determining the first coefficient of the second linear combination and/or the second coefficient of the second linear combination depending on the first normal stress measurement signal and depending on the second normal stress measurement signal.

Equations (26), (27) and (28) are analogously applicable in this case, just like equations (35), (36), (37), (38) and (39).

In exemplary embodiments, the integrated Hall sensor device has a first normal stress sensor for generating a first normal stress measurement signal corresponding to a first normal stress acting on the first vertical Hall element in the semiconductor chip, said first normal stress acting in the x-direction, wherein the integrated Hall sensor device has as second normal stress sensor for generating a second normal stress measurement signal corresponding to a second normal stress acting on the first vertical Hall element in the semiconductor chip, said second normal stress acting in the y-direction, wherein the integrated Hall sensor device has a third normal stress sensor for generating a third normal stress measurement signal corresponding to a third normal stress acting on the second vertical Hall element in the semiconductor chip, said third normal stress acting in the x-direction, wherein the integrated Hall sensor device has a fourth normal stress sensor for generating a fourth normal stress measurement signal corresponding to a fourth normal stress acting on the second vertical Hall element in the semiconductor chip, said fourth normal stress acting in the y-direction, wherein the evaluation device is configured for determining the first coefficient of the first linear combination and/or the second coefficient of the first linear combination depending on the first normal stress measurement signal and depending on the second normal stress measurement signal, and wherein the evaluation device is configured for determining the first coefficient of the second linear combination and/or the second coefficient of the second linear combination depending on the third normal stress measurement signal and depending on the fourth normal stress measurement signal.

Taking account of the first normal stress measurement signal, the second normal stress measurement signal, the third normal stress measurement signal and the fourth normal stress measurement signal can generally be expressed mathematically by the equation:

$$E=f_{28}(Voutx, Vouty, VsigmaXY, VsigmaXX, VsigmaYY, VsigmaXX2, VsigmaYY2) \quad (40),$$

or by the equation:

$$E=f_{29}(Voutx, Vouty, VsigmaXY, VsigmaXY2, VsigmaXX, VsigmaYY, VsigmaXX2, VsigmaYY2) \quad (41),$$

wherein E is the respective property of the magnetic field, wherein Voutx is the value of the first magnetic field measurement signal, wherein Vouty is the value of the second magnetic field measurement signal, wherein VsigmaXY is the value of the first shear stress measurement signal, wherein VsigmaXY2 is the value of the second shear stress measurement signal, wherein VsigmaXX is the value of the first normal stress measurement signal, wherein VsigmaYY is the value of the second normal stress measurement signal, wherein VsigmaXX2 is the value of the third normal stress measurement signal, and wherein VsigmaYY2 is the value of the fourth normal stress measurement signal. A suitable function $f_{28}$ or $f_{29}$ can be ascertained for example by experiments or computational simulations.

The influence of the values VsigmaXX and VsigmaYY of the first and second normal stress measurement signals on the cross-sensitivity:

$$Sxy=f_{30}(VsigmaXY, VsigmaXX, VsigmaYY) \quad (42)$$

can be taken into account by means of suitable functions $f_{27}$. The functions can be ascertained for example by experiments or computational simulations.

The influence of the values VsigmaXX2 and VsigmaYY2 of the third and fourth normal stress measurement signals on the cross-sensitivity:

$$Syx=f_{31}(VsigmaXY, VsigmaXX2, VsigmaYY2) \quad (43)$$

and respectively:

$$Syx=f_{32}(VsigmaXY2, VsigmaXX2, VsigmaYY2) \quad (44)$$

can be taken into account by means of suitable functions $f_{31}$ or $f_{32}$. The functions can be ascertained for example by experiments or computational simulations.

The influence of the values VsigmaXX and VsigmaYY of the first and second normal stress measurement signals on the magnetic sensitivity:

$$Sxx = f_{33}(VsigmaXX, VsigmaYY) \quad (45)$$

can be taken into account by means of suitable functions $f_{33}$. The functions can be ascertained for example by experiments or computational simulations.

The influence of the values VsigmaXX2 and VsigmaYY2 of the third and fourth normal stress measurement signals on the magnetic sensitivity:

$$Syy = f_{34}(VsigmaXX2, VsigmaYY2) \quad (46)$$

can be taken into account by means of suitable functions $f_{34}$. The functions can be ascertained for example by experiments or computational simulations.

In exemplary embodiments, a temperature sensor for generating a temperature measurement signal is configured on the semiconductor chip, wherein the temperature measurement signal corresponds to a temperature of the semiconductor chip, wherein the evaluation device is configured for determining the first coefficient of the first linear combination and/or the second coefficient of the first linear combination depending on the temperature measurement signal.

Taking account of the temperature measurement signal can generally be expressed mathematically by the equation:

$$E = f_{35}(Voutx, Vouty, VsigmaXY, VT) \quad (47),$$

wherein E is the respective property of the magnetic field, wherein Voutx is the value of the first magnetic field measurement signal, wherein Vouty is the value of the second magnetic field measurement signal, wherein VsigmaXY is the value of the first shear stress measurement signal, and wherein VT is the value of the temperature measurement signal. A suitable function f can be ascertained for example by experiments or computational simulations.

Equations (10) to (14) are analogously applicable in this case, too. It holds true that both the magnetic cross-sensitivity Sxy of the first Hall sensor and the magnetic cross-sensitivity Syx of the second Hall sensor are also dependent on the value VT of the temperature measurement signal.

The influence of the value VT of the temperature measurement signal on the cross-sensitivities:

$$Sxy = f_{36}(VsigmaXY, VT) \quad (48),$$

and $$Syx = f_{37}(VsigmaXY, VT) \quad (49),$$

and respectively:

$$Syx = f_{38}(VsigmaXY2, VT) \quad (50)$$

can be taken into account by means of suitable functions $f_{36}$, $f_{37}$ and $f_{38}$, respectively. The functions can be ascertained for example by experiments or computational simulations.

Furthermore, the magnetic sensitivity of the first Hall sensor Sxx and the magnetic sensitivity of the second Hall sensor Syy are dependent, albeit to a lesser extent, on the value VT of the temperature measurement signal.

The influence of the value VT of the temperature measurement signal on the magnetic sensitivities Sxx and Syy:

$$Sxx = f_{39}(, VT) \quad (51),$$

and $$Syy = f_{40}(, VT) \quad (52)$$

can be compensated for by means of suitable functions $f_{39}$ and $f_{40}$. The functions can be ascertained for example by experiments or computational simulations.

In exemplary embodiments, a temperature sensor for generating a temperature measurement signal is configured on the semiconductor chip, wherein the temperature measurement signal corresponds to a temperature of the semiconductor chip, wherein the evaluation device is configured for determining the first coefficient of the second linear combination and/or the second coefficient of the second linear combination depending on the temperature measurement signal.

Equations (26), (27) and (28) are analogously applicable in this case, just like equations (47), (48), (49), (50), (51) and (52).

What is furthermore disclosed is an angle measuring device including an integrated Hall sensor device of the type described and including a magnet for generating the magnetic field, said magnet being rotatable about a z-axis of the coordinate system, wherein the integrated Hall sensor device is configured and arranged for detecting an angular position of the magnet on the basis of the angular position of the magnetic field generated by the magnet.

What is furthermore disclosed is a method for measuring a magnetic field by means of an integrated Hall sensor device including a semiconductor chip oriented parallel to an xy-plane spanned by an x-axis and by a y-axis of a three-dimensional cartesian coordinate system, wherein the method includes the following steps:

generating a first magnetic field measurement signal by means of a first Hall sensor, said first Hall sensor having a first vertical Hall element configured on the semiconductor chip in such a way that, if said first vertical Hall element is mechanically stress-free, the first magnetic field measurement signal is dependent on a component of the magnetic field acting parallel to the x-axis and is independent of a component of the magnetic field acting parallel to the y-axis;

generating a second magnetic field measurement signal by means of a second Hall sensor, said second Hall sensor having a second vertical Hall element configured on the semiconductor chip in such a way that, if said second vertical Hall element is mechanically stress-free, the second magnetic field measurement signal is dependent on the component of the magnetic field acting parallel to the y-axis and is independent of the component of the magnetic field acting parallel to the x-axis;

measuring mechanical stresses in the semiconductor chip by means of a first stress sensor, wherein the first stress sensor is configured for generating a first shear stress measurement signal corresponding to a first shear stress acting on the first vertical Hall element, said first shear stress acting in a plane perpendicular to the x-axis parallel to the y-axis; and determining one or more properties of the magnetic field, by means of an evaluation device, depending on the first magnetic field measurement signal, depending on the second magnetic field measurement signal and depending on the first shear stress measurement signal.

BRIEF DESCRIPTION OF THE DRAWINGS

Exemplary embodiments of the present invention are described below with reference to the accompanying figures.

DETAILED DESCRIPTION

In the description below, identical or equivalent elements or elements having an identical or equivalent function are designated by identical or equivalent reference signs.

The features illustrated serve for more detailed explanation of exemplary embodiments of the present invention. However, it is evident to those skilled in the art in the field of the invention that exemplary embodiments of the present invention can also be implemented with omission of individual features from among those described. In addition thereto, features of the different exemplary embodiments described below can be combined with one another, unless explicitly indicated otherwise.

Figure 1:
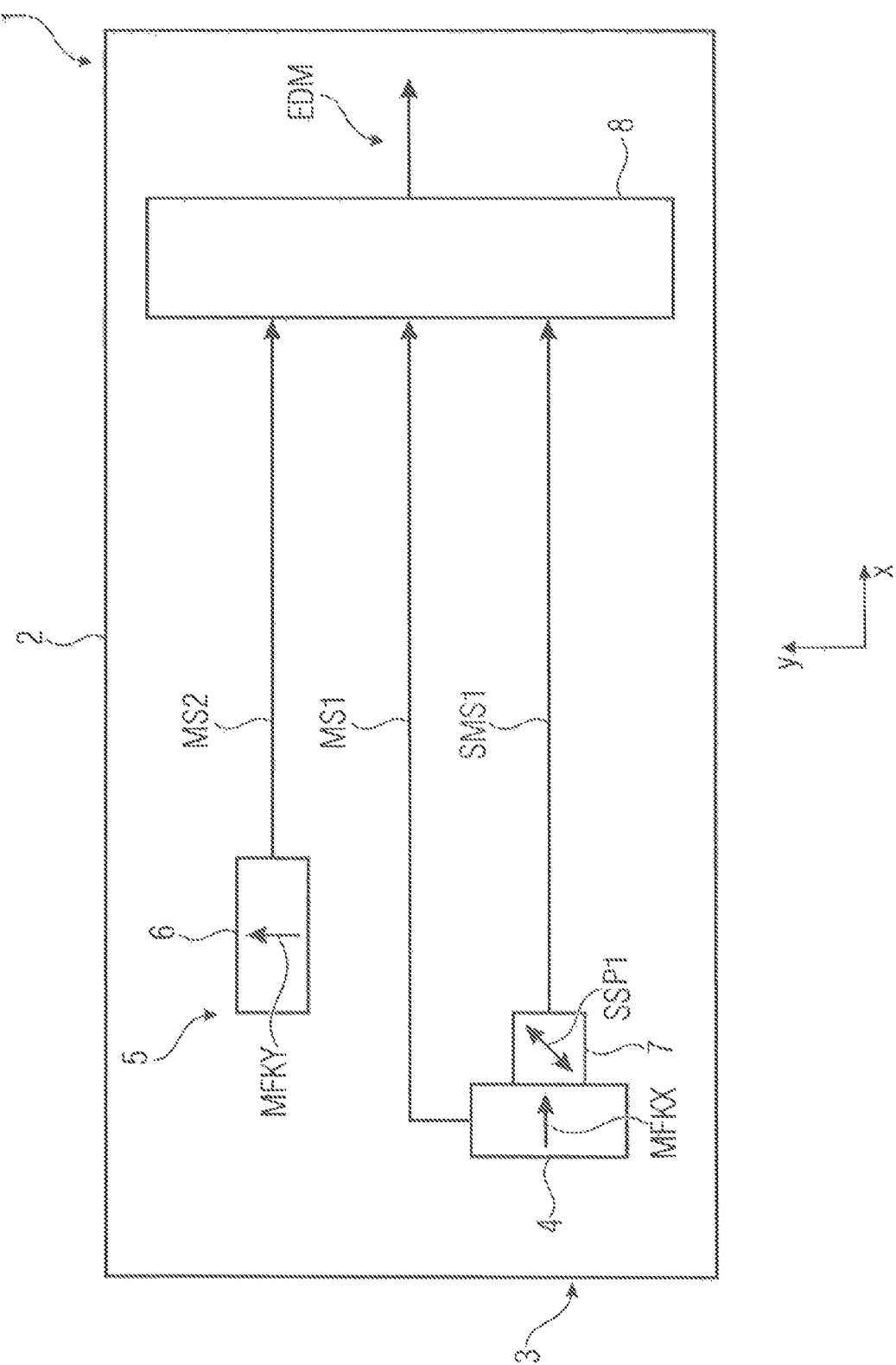
FIG. 1 shows a first exemplary embodiment of an integrated Hall sensor device in a schematic plan view.

FIG. 1 shows a first exemplary embodiment of an integrated Hall sensor device 1 in a schematic plan view. The integrated Hall sensor device for measuring a magnetic field comprises a semiconductor chip 2 oriented parallel to an xy-plane spanned by an x-axis and by a y-axis of a three-dimensional cartesian coordinate system;

a first Hall sensor 3 for generating a first magnetic field measurement signal MS1, said first Hall sensor having a first vertical Hall element 4 configured on the semiconductor chip 2 in such a way that, if said first vertical Hall element is mechanically stress-free, the first magnetic field measurement signal MS1 is dependent on a component MFKX of the magnetic field acting parallel to the x-axis and is independent of a component MFKY of the magnetic field acting parallel to the y-axis;

a second Hall sensor 5 for generating a second magnetic field measurement signal MS2, said second Hall sensor having a second vertical Hall element 6 configured on the semiconductor chip 2 in such a way that, if said second vertical Hall element is mechanically stress-free, the second magnetic field measurement signal MS2 is dependent on the component MFKY of the magnetic field acting parallel to the y-axis and is independent of the component MFKX of the magnetic field acting parallel to the x-axis;

a first stress sensor 7 for measuring mechanical stresses in the semiconductor chip 2, wherein the first stress sensor 7 is configured for generating a first shear stress measurement signal SMS1 corresponding to a first shear stress SSP1 acting on the first vertical Hall element 4, said first shear stress acting in a plane perpendicular to the x-axis parallel to the y-axis; and an evaluation device 8 for determining one or more properties EDM of the magnetic field depending on the first magnetic field measurement signal MS1, depending on the second magnetic field measurement signal MS2 and depending on the first shear stress measurement signal SMS1.

Furthermore, FIG. 1 illustrates a method for measuring a magnetic field by means of an integrated Hall sensor device 1 comprising a semiconductor chip 2 oriented parallel to an xy-plane spanned by an x-axis and by a y-axis of a three-dimensional cartesian coordinate system, wherein the method comprises the following steps:

generating a first magnetic field measurement signal MS1 by means of a first Hall sensor 3, said first Hall sensor having a first vertical Hall element 4 configured on the semiconductor chip 2 in such a way that, if said first vertical Hall element is mechanically stress-free, the first magnetic field measurement signal MS1 is dependent on a component MFKX of the magnetic field acting parallel to the x-axis and is independent of a component MFKY of the magnetic field acting parallel to the y-axis;

generating a second magnetic field measurement signal MS2 by means of a second Hall sensor 5, said second Hall sensor having a second vertical Hall element 6 configured on the semiconductor chip 2 in such a way that, if said second vertical Hall element is mechanically stress-free, the second magnetic field measurement signal MS2 is dependent on the component MFKY of the magnetic field acting parallel to the y-axis and is independent of the component MFKX of the magnetic field acting parallel to the x-axis;

measuring mechanical stresses in the semiconductor chip 2 by means of a first stress sensor 7, wherein the first stress sensor 7 is configured for generating a first shear stress measurement signal SMS1 corresponding to a first shear stress SSP1 acting on the first vertical Hall element 4, said first shear stress acting in a plane perpendicular to the x-axis parallel to the y-axis; and determining one or more properties EDM of the magnetic field, by means of an evaluation device 8, depending on the first magnetic field measurement signal MS1, depending on the second magnetic field measurement signal MS2 and depending on the first shear stress measurement signal SMS1.

It is assumed in FIG. 1 that the first shear stress SSP1 acts on the vertical Hall elements 4 and 6 in the same way. In this case, only the first stress sensor 7 is required.

Figure 2:
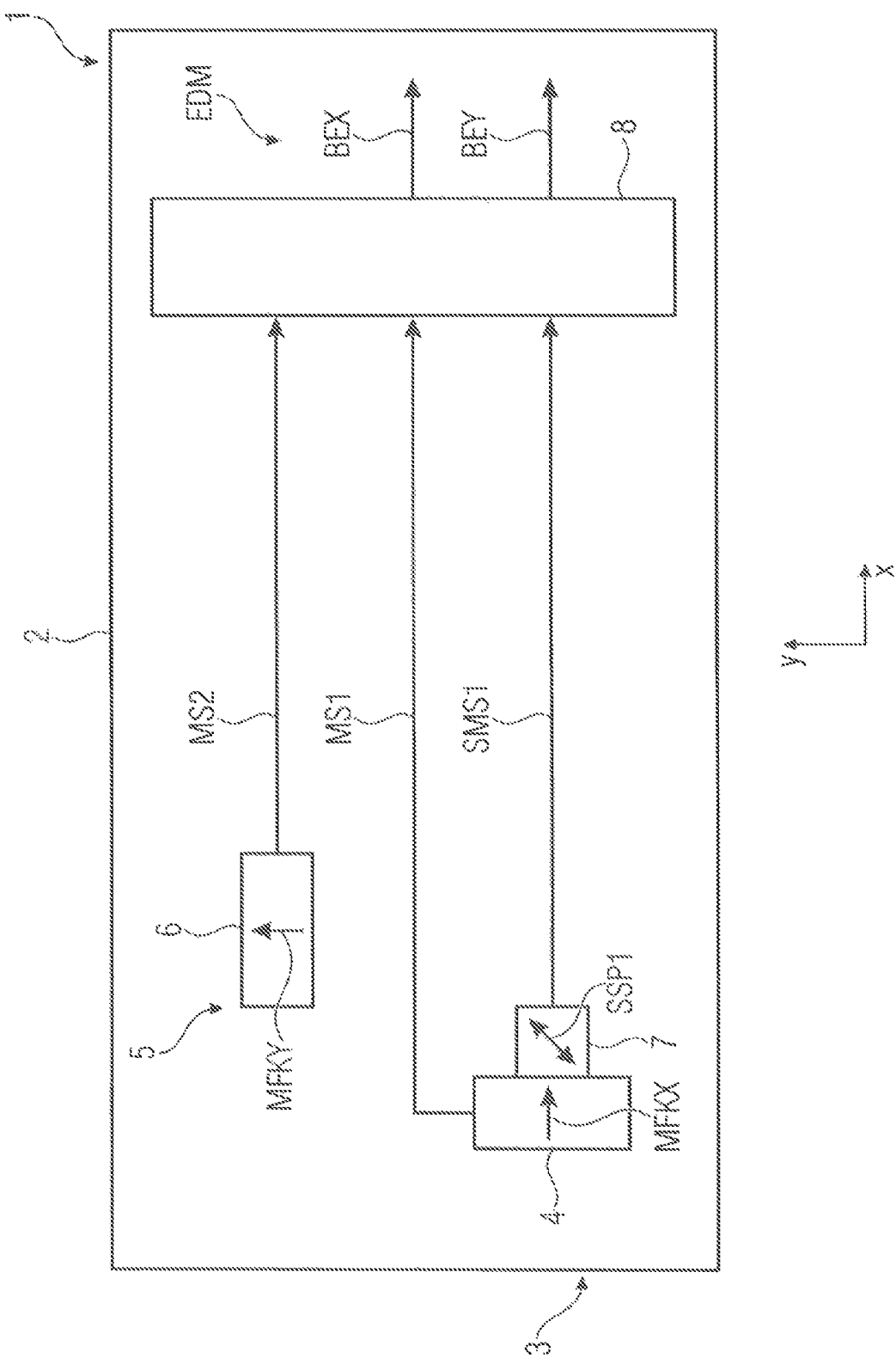
FIG. 2 shows a second exemplary embodiment of an integrated Hall sensor device in a schematic plan view.

FIG. 2 shows a second exemplary embodiment of an integrated Hall sensor device 1 in a schematic plan view.

In exemplary embodiments, the one or more properties EDM of the magnetic field comprise a value BEX of the component MFKX of the magnetic field acting in the x-direction.

In exemplary embodiments, the evaluation device 8 is configured for determining the value BEX of the component MFKX of the magnetic field acting in the x-direction on the basis of a first linear combination of the first magnetic field measurement signal MS1 and the second magnetic field measurement signal MS2, wherein the evaluation device 8 is configured for determining a first coefficient of the first linear combination and/or a second coefficient of the first linear combination depending on the first shear stress measurement signal SMS1.

In exemplary embodiments, the one or more properties EDM of the magnetic field alternatively or additionally comprise a value BEY of the component MFKY acting in the y-direction.

In exemplary embodiments, the evaluation device 8 is configured for determining the value BEY of the component MFKY of the magnetic field acting in the y-direction on the basis of a second linear combination of the first magnetic field measurement signal MS1 and the second magnetic field measurement signal MS2, wherein the evaluation device 8 is configured for determining a first coefficient of the second linear combination and/or a second coefficient of the second linear combination depending on the first shear stress measurement signal SMS1.

Figure 3:
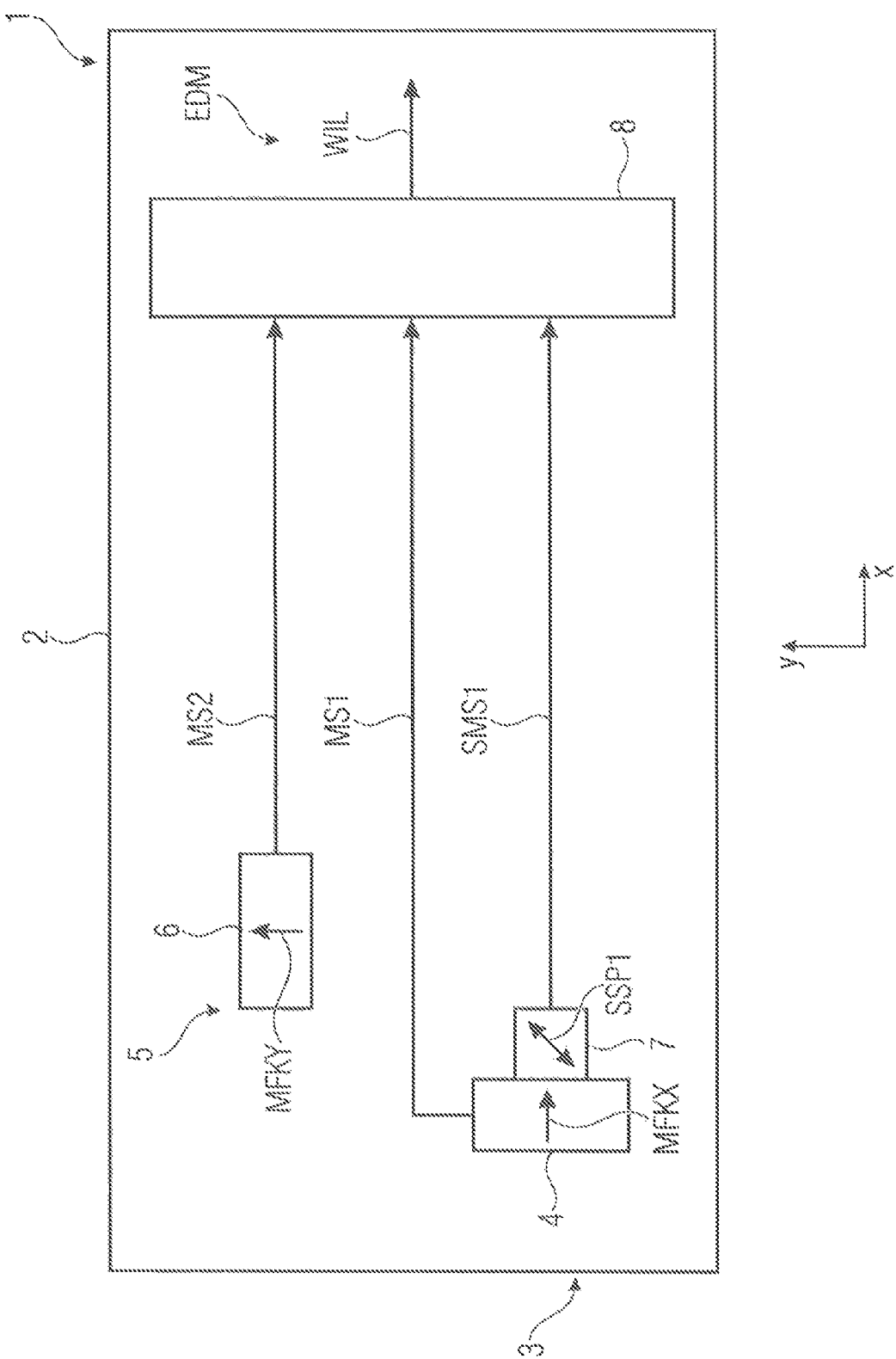
FIG. 3 shows a third exemplary embodiment of an integrated Hall sensor device in a schematic plan view.

FIG. 3 shows a third exemplary embodiment of an integrated Hall sensor device 1 in a schematic plan view.

In exemplary embodiments, the one or more properties EDM of the magnetic field alternatively or additionally comprise an angular position WIL of the magnetic field in the xy-plane.

Figure 4:
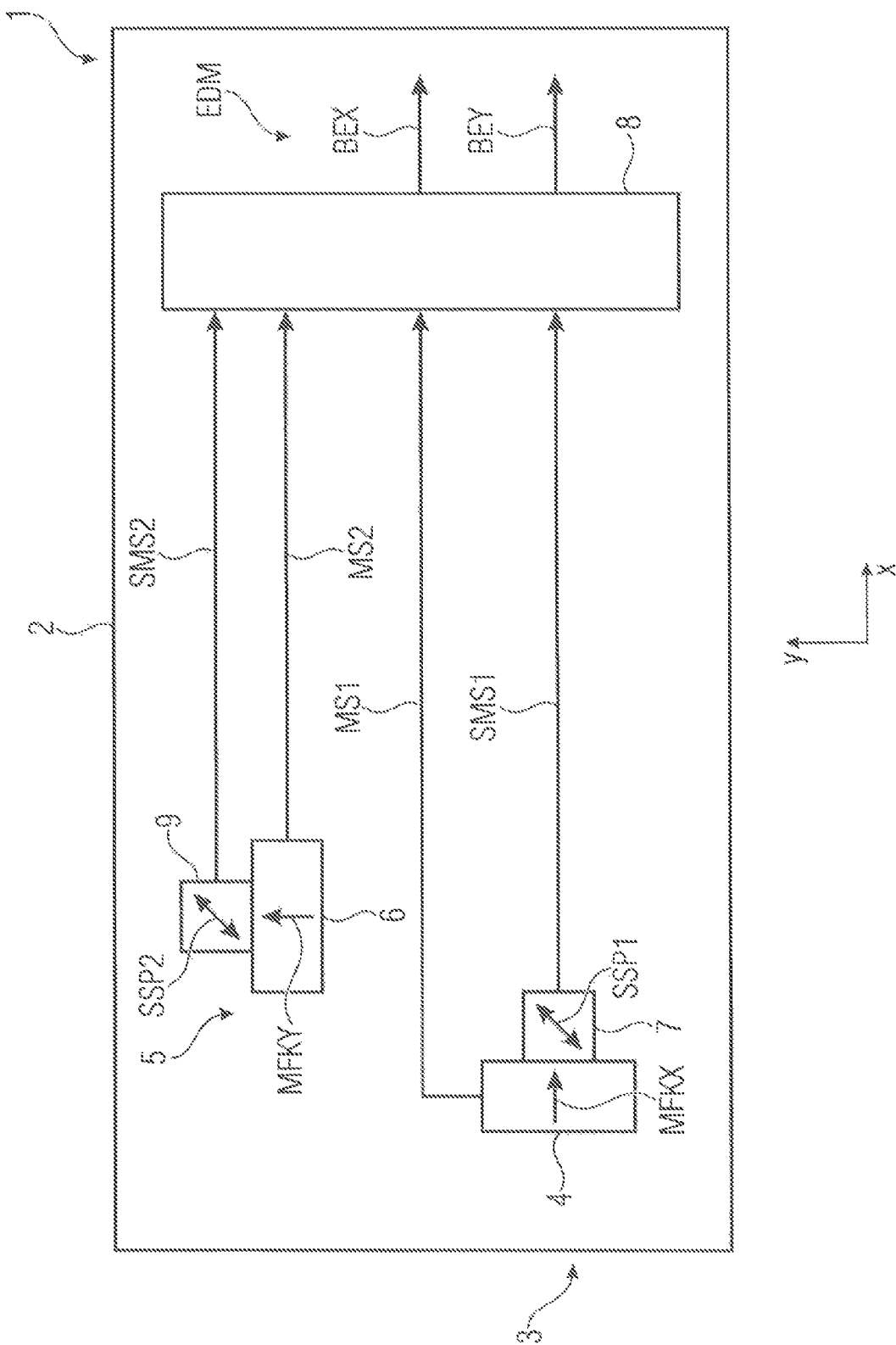
FIG. 4 shows a fourth exemplary embodiment of an integrated Hall sensor device in a schematic plan view.

FIG. 4 shows a fourth exemplary embodiment of an integrated Hall sensor device 1 in a schematic plan view.

In exemplary embodiments, the integrated Hall sensor device 1 comprises a second stress sensor 9 for generating a second shear stress measurement signal SMS2 corresponding to a second shear stress SSP2 acting on the second vertical Hall element 6, said second shear stress acting in a plane perpendicular to the x-axis parallel to the y-axis, wherein the evaluation device 8 is configured for determining the one or more properties EDM of the magnetic field depending on the first magnetic field measurement signal MS1, depending on the second magnetic field measurement signal MS2, depending on the first shear stress measurement signal SMS1 and depending on the second shear stress measurement signal SMS2.

In exemplary embodiments, the evaluation device 8 is configured for determining the value BEX of the component MFKX of the magnetic field acting in the x-direction on the basis of a first linear combination of the first magnetic field measurement signal MS1 and the second magnetic field measurement signal MS2, wherein the evaluation device 8 is configured for determining a first coefficient of the first linear combination and/or a second coefficient of the first linear combination depending on the first shear stress measurement signal SMS1 and the second shear stress measurement signal SMS2.

In exemplary embodiments, the evaluation device 8 is configured for determining the value BEY of the component MFKY of the magnetic field acting in the y-direction on the basis of a second linear combination of the first magnetic field measurement signal MS1 and the second magnetic field measurement signal MS2, wherein the evaluation device 8 is configured for determining a first coefficient of the second linear combination and/or a second coefficient of the second linear combination depending on the first shear stress measurement signal SMS1 and the second shear stress measurement signal SMS2.

In FIG. 4 it is assumed that the first shear stress SSP1 acting on the first vertical Hall element 4 and the second shear stress SSP2 acting on the second vertical Hall element 6 are significantly different, such that they are measured separately from one another by means of the stress sensors 7 and 9.

Figure 5:
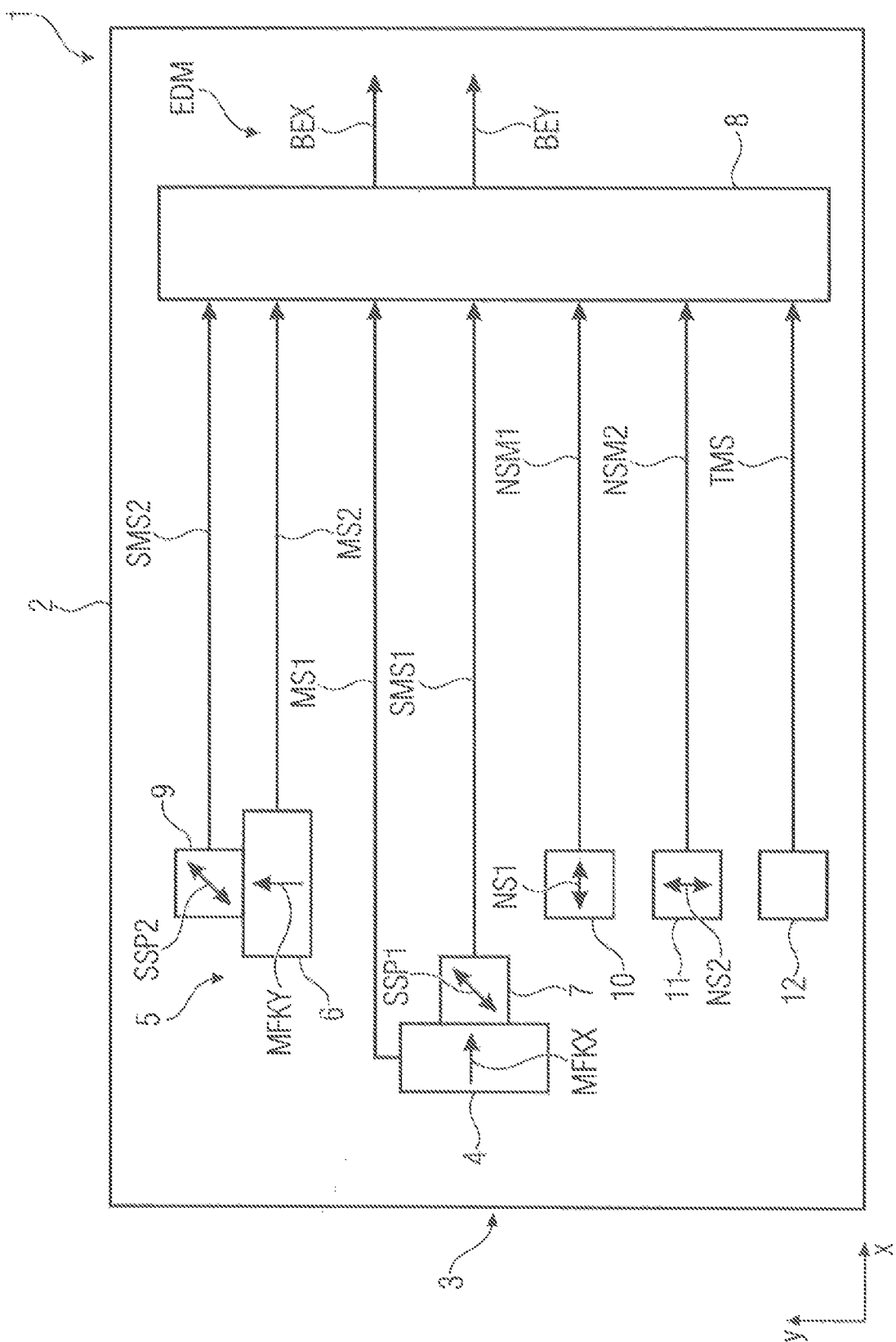
FIG. 5 shows a fifth exemplary embodiment of an integrated Hall sensor device in a schematic plan view.

FIG. 5 shows a fifth exemplary embodiment of an integrated Hall sensor device 1 in a schematic plan view.

In exemplary embodiments, the integrated Hall sensor device 1 has a first normal stress sensor 10 for generating a first normal stress measurement signal NSM1 corresponding to a first normal stress NS1 in the semiconductor chip 2, said first normal stress acting in the x-direction, and wherein the integrated Hall sensor device 1 has a second normal stress sensor 11 for generating a second normal stress measurement signal NSM2 corresponding to a second normal stress NS2 in the semiconductor chip 2, said second normal stress acting in the y-direction, wherein the evaluation device 8 is configured for determining the first coefficient of the first linear combination and/or the second coefficient of the first linear combination depending on the first normal stress measurement signal NSM1 and depending on the second normal stress measurement signal NSM2.

In exemplary embodiments, the integrated Hall sensor device 1 has a first normal stress sensor 10 for generating a first normal stress measurement signal NSM1 corresponding to a first normal stress NS1 in the semiconductor chip 2, said first normal stress acting in the x-direction, and wherein the integrated Hall sensor device 1 has a second normal stress sensor 11 for generating a second normal stress measurement signal NSM2 corresponding to a second normal stress NS2 in the semiconductor chip 2, said second normal stress acting in the y-direction, wherein the evaluation device 8 is configured for determining the first coefficient of the second linear combination and/or the second coefficient of the second linear combination depending on the first normal stress measurement signal NSM1 and depending on the second normal stress measurement signal NSM2.

In exemplary embodiments, a temperature sensor 12 for generating a temperature measurement signal TMS is configured on the semiconductor chip 2, wherein the temperature measurement signal TMS corresponds to a temperature of the semiconductor chip 2, wherein the evaluation device 8 is configured for determining the first coefficient of the first linear combination and/or the second coefficient of the first linear combination depending on the temperature measurement signal TMS.

In exemplary embodiments, a temperature sensor 12 for generating a temperature measurement signal TMS is configured on the semiconductor chip 2, wherein the temperature measurement signal TMS corresponds to a temperature of the semiconductor chip 2, wherein the evaluation device 8 is configured for determining the first coefficient of the second linear combination and/or the second coefficient of the second linear combination depending on the temperature measurement signal TMS.

Figure 6:
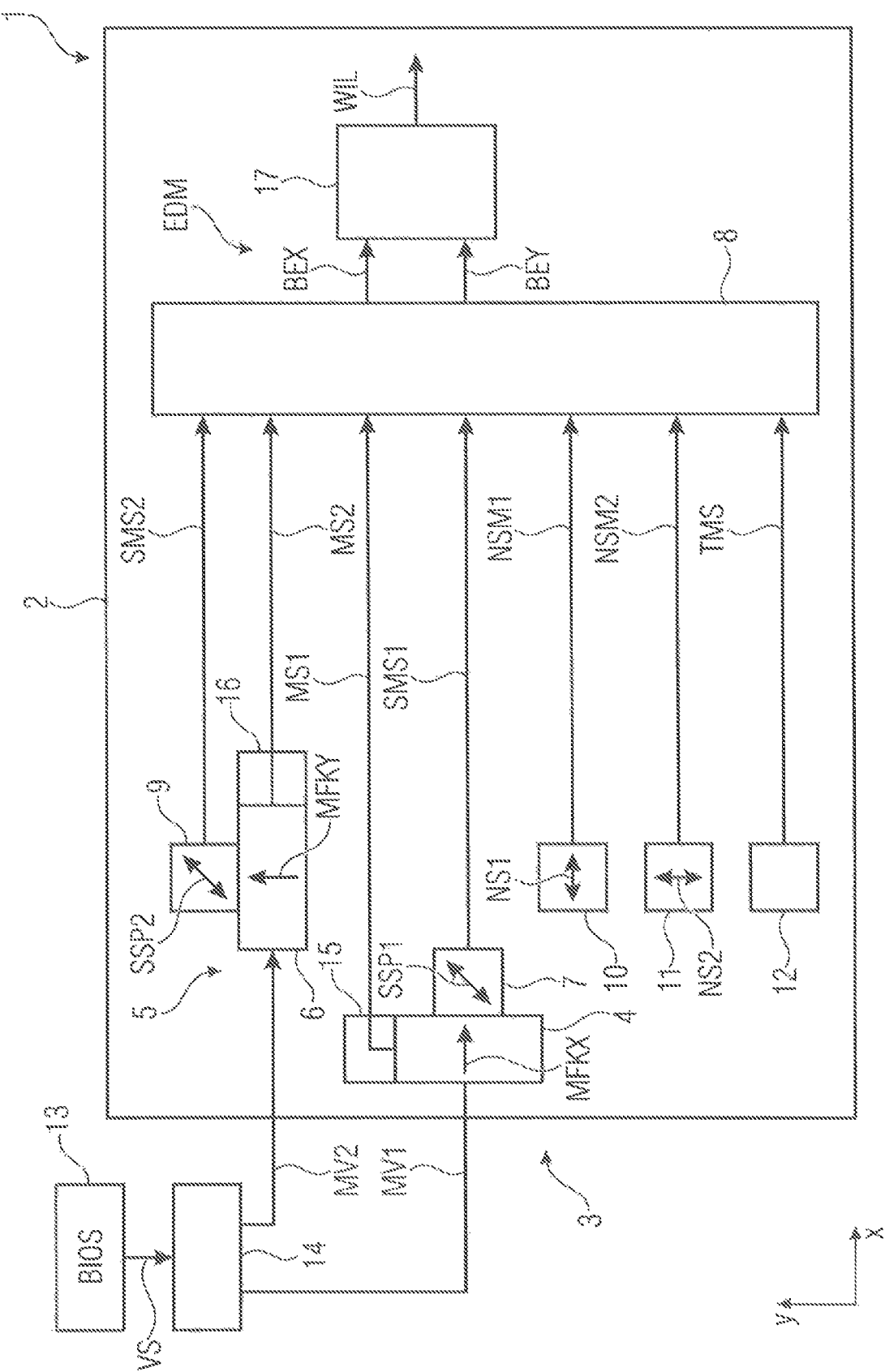
FIG. 6 shows a sixth exemplary embodiment of an integrated Hall sensor device in a schematic plan view.

FIG. 6 shows a sixth exemplary embodiment of an integrated Hall sensor device 1 in a schematic plan view. The integrated Hall sensor device 1 in FIG. 6 additionally comprises a voltage supply 13. A modulator 14 is furthermore provided, which modulates a supply voltage or a supply current VS of the voltage supply 13. The first Hall element 4 is supplied with a first modulated supply voltage MV1 by the modulator 14. The second Hall element 6 is analogously supplied with a second modulated supply voltage MV2 by the modulator 14. A first demodulator 15 is connected downstream of the first Hall element 4 and supplies the first magnetic field measurement signal MS1. Furthermore, a second demodulator 16 is connected downstream of the second Hall element 6 and supplies the second magnetic field measurement signal MS2.

The modulation and demodulation of the supply voltage VS serves for balancing the Hall elements 4 and 6. In this case, by way of example, the modulated supply voltages MV1 and MV2 can be subjected periodically to polarity reversal. Likewise, the inputs and the outputs of the Hall elements 4 and 6 can be periodically interchanged. The spinning current Hall probe method known in the prior art can thus be implemented, which can be used to eliminate the zero error of the Hall elements in the useful signal.

The demodulators 15 and 16 can include preamplifiers and/or analog/digital converters connected downstream.

The magnetic field measurement signals MS1 and MS2 can thus be analog or digital signals. Furthermore, they can be voltage signals or current signals.

Furthermore, the integrated Hall sensor device 1 comprises an angle detection stage 17, which ascertains the angular position WIL of the magnetic field in the xy-plane, for example by means of an arc-tangent function, from the value of the component of the magnetic field BEX acting in the x-direction and the value of the component of the magnetic field BEY acting in the y-direction. The angle detection stage 17 can utilize a CORDIC algorithm (abbreviation of Coordinate Rotation Digital Computer) for this purpose.

In other exemplary embodiments, the angle detection stage 17 can be integrated in the evaluation device 8. In this case, it is possible firstly, on the basis of the uncorrected magnetic field measurement signals MS1 and MS2, to ascertain an uncorrected angular position of the magnetic field in the xy-plane, which disregards the mechanical shear stresses and the normal stresses. A correction angle can then be ascertained on the basis of the shear stresses and/or the normal stresses, with which correction angle the uncorrected angular position can be corrected in order thus to ascertain the angular position WIL of the magnetic field in the xy-plane.

The stress sensors 7 and 9 and also the normal stress sensors 10 and 11 can be operated continuously or intermittently. Energy can be saved in the latter case. Since mechanical stresses normally do not change in the microseconds or milliseconds range, it can be sufficient to generate only one measurement value per sensor and second. Alternatively, ambient conditions, such as the temperature, for example, can also be taken into account in the choice of the operating mode. By way of example, in the case of great temperature changes, the number of measurement values per unit time can be increased.

Figure 7:
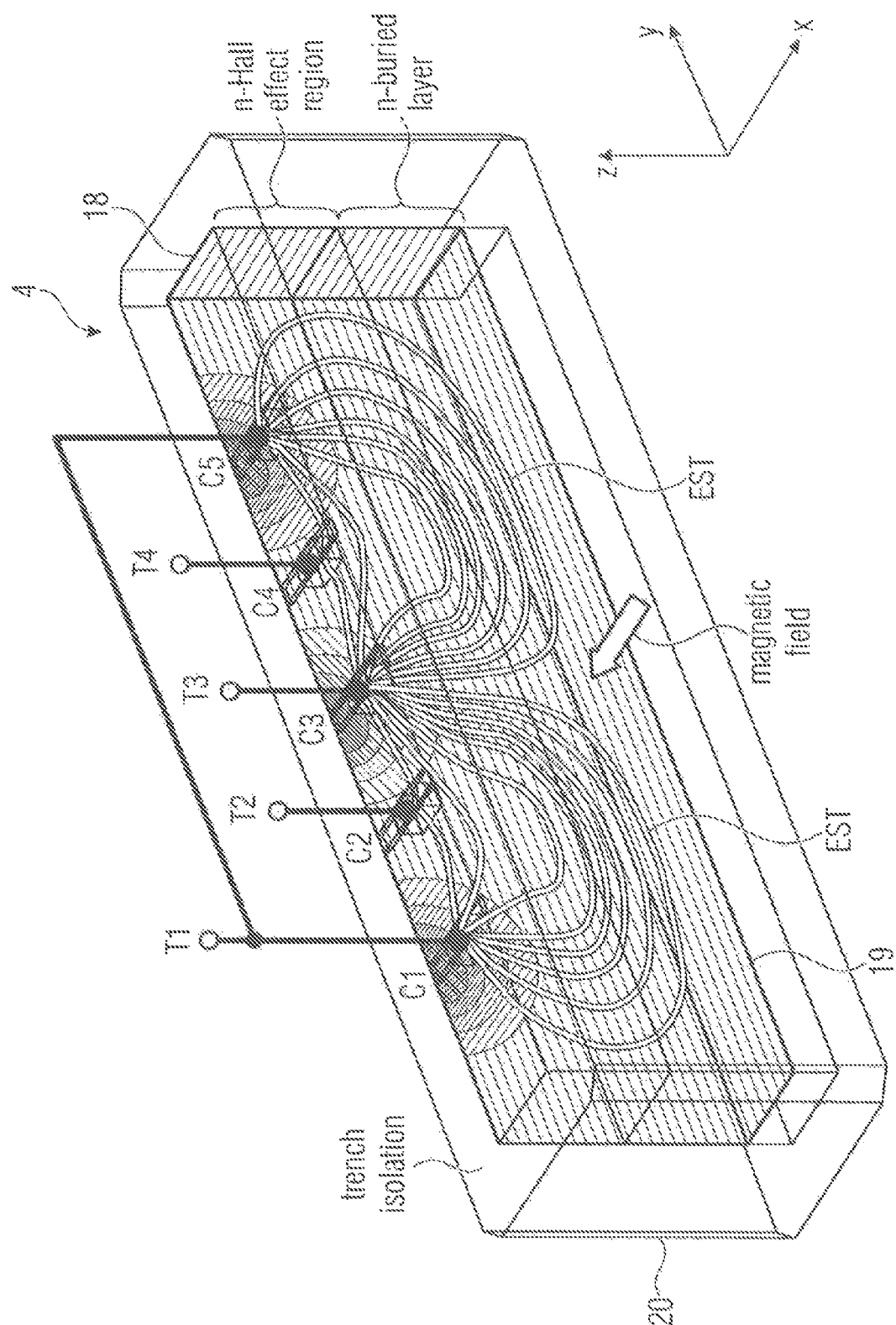
FIG. 7 shows one example of a first vertical Hall element in a first operating state in a schematic three-dimensional illustration.

FIG. 7 shows one example of a first vertical Hall element 4 in a first operating state in a schematic three-dimensional illustration. The first vertical Hall element 4 comprises a Hall effect region 18 arranged above an embedded layer 19. The Hall effect region 18 and the embedded layer 19 are arranged in an isolation trench 20.

The first vertical Hall element 4 has 5 contacts C1 to C5 and 4 terminals T1 to T4. In this case, the contacts C1 and C5 are connected to the terminal T1. Furthermore, the contact C2 is connected to the terminal T2, the contact C3 is connected to the terminal T3, and the contact C4 is connected to the terminal T4.

In the operating state in FIG. 7, the terminals T1 and T3 serve as input, for an excitation current, such that the excitation current lines EST run between the contacts C1 and C3 and also between the contacts C5 and C3. The polarity of the excitation current can be changed periodically in this case. An external magnetic field deflects the charge carriers of the excitation current, such that an electrical signal dependent on the magnetic field arises at the terminals T2 and T4 serving as output.

Figure 8:
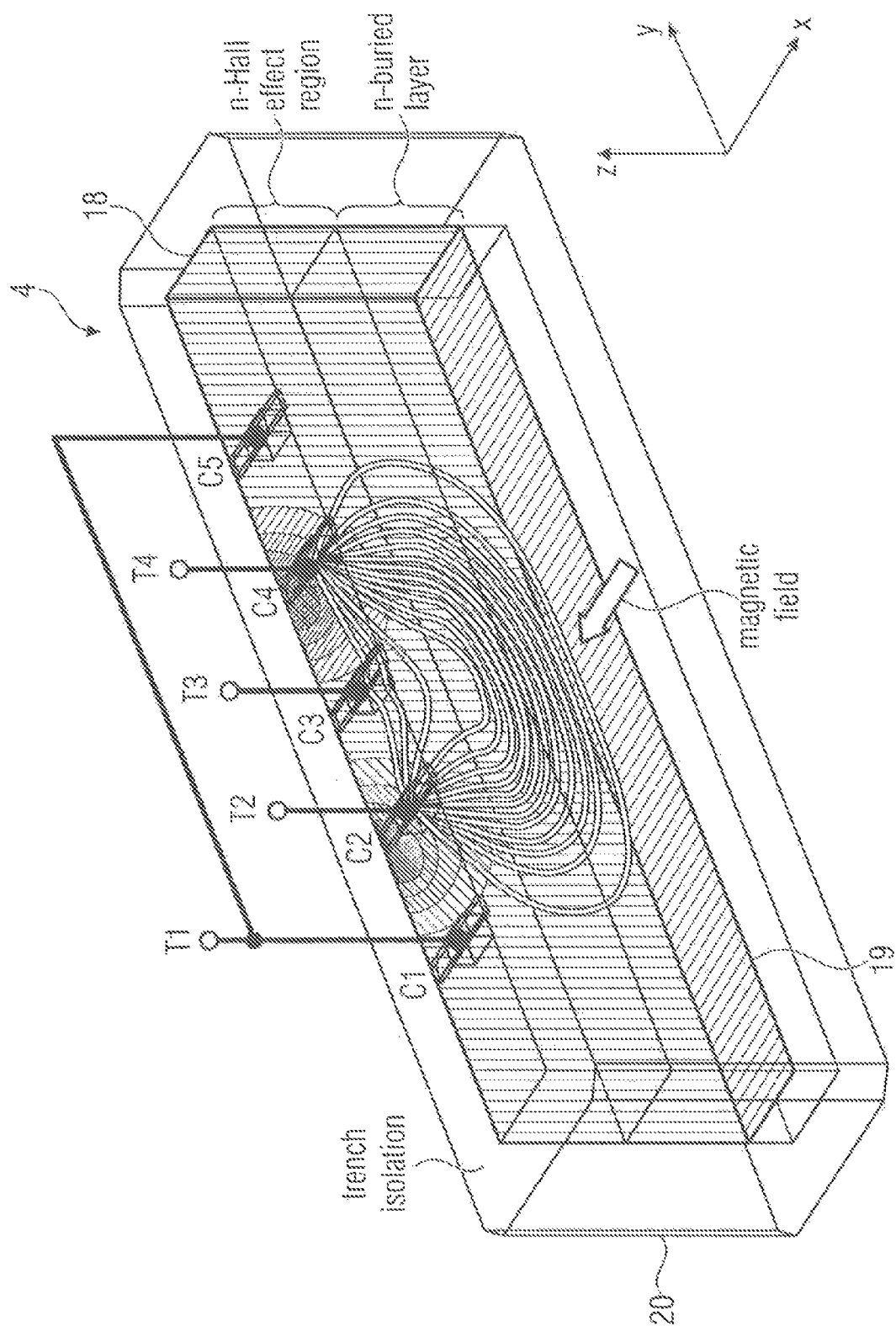
FIG. 8 shows the example of a first vertical Hall element in a second operating state in a schematic three-dimensional illustration.

FIG. 8 shows the example of a first vertical Hall element 4 in a second operating state in a schematic three-dimensional illustration.

In the operating state in FIG. 8, the terminals T2 and T4 serve as input, for the excitation current, such that the excitation current lines EST run between the contacts C2 and C4. The polarity of the excitation current can be changed periodically in this case. An external magnetic field deflects the charge carriers of the excitation current, such that an electrical signal dependent on the magnetic field arises at the terminals T1 and T3 serving as output.

The control of the operating states and also the polarity of the excitation current can be controlled by the modulator 14 in this case.

The second vertical Hall element 6 can be constructed and operated analogously.

Figure 9:
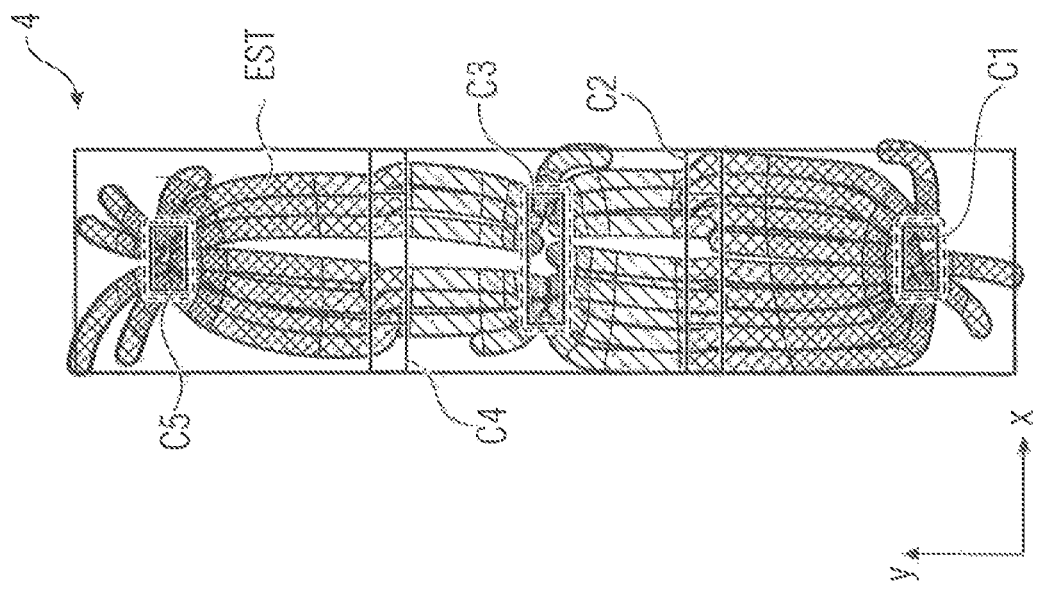
FIG. 9 shows exemplary excitation current lines in a first vertical Hall element exposed to a shear stress in a schematic plan view.

FIG. 9 shows exemplary excitation current lines EST in a first vertical Hall element 4 exposed to a shear stress, in a schematic plan view. Without shear stress, the excitation current lines EST would run mirror-symmetrically with respect to an axis of symmetry of the first vertical Hall element 4 running parallel to the y-axis. In this case, the first vertical Hall element 4 would respond exclusively to the x-component MFKX of an external magnetic field.

On account of the shear stress acting, however, the excitation current lines EST are rotated slightly in the clockwise direction in FIG. 9. As a result, the first vertical Hall element 4, at least to a small extent, also responds to the y-component MFKY of the external magnetic field, with the result that measurement inaccuracies arise. The integrated Hall sensor device 1 disclosed compensates for such measurement inaccuracies, such that the latter can be either avoided or at least reduced.

Figure 10:
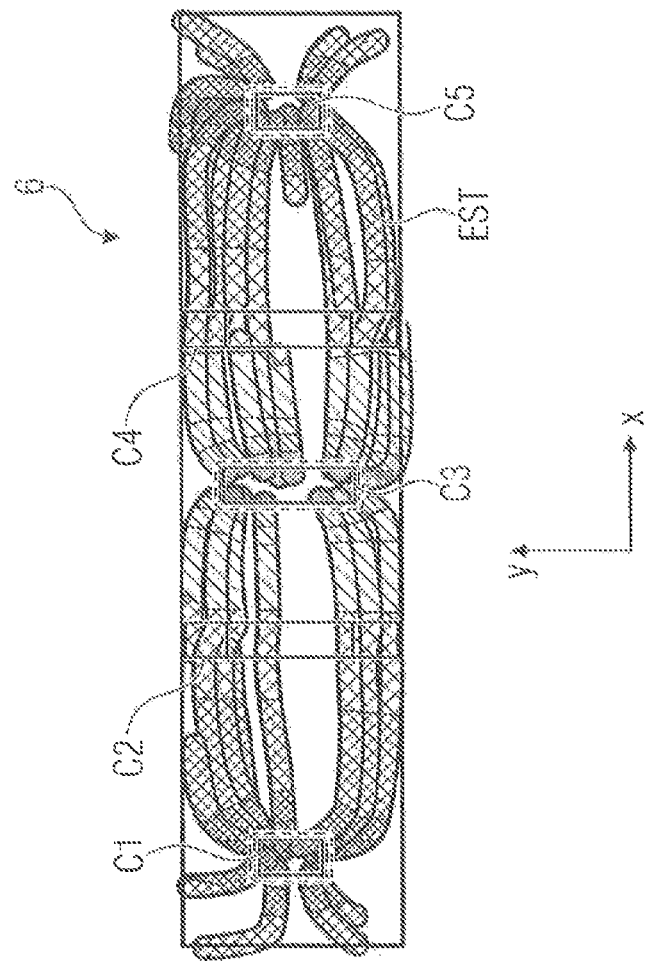
FIG. 10 shows exemplary excitation current lines in a second vertical Hall element exposed to a shear stress in a schematic plan view.

FIG. 10 shows exemplary excitation current lines in a second vertical Hall element exposed to a shear stress, in a schematic plan view. Without shear stress, the excitation current lines EST would run mirror-symmetrically with respect to an axis of symmetry of the second vertical Hall element 6 running parallel to the x-axis. In this case, the second vertical Hall element 6 would respond exclusively to the y-component MFKY of an external magnetic field.

On account of the shear stress acting, however, the excitation current lines EST are rotated slightly in the counterclockwise direction in FIG. 10. As a result, the second vertical Hall element 6, at least to a small extent, also responds to the x-component MFKX of the external magnetic field, with the result that measurement inaccuracies arise. The integrated Hall sensor device 1 disclosed compensates for such measurement inaccuracies, such that the latter can be either avoided or at least reduced.

Such a slight rotation or bending of the current flow lines by the mechanical shear stress owing to the piezoresistive effect takes effect in all embodiments of vertical Hall elements mentioned in the introduction. It is thus not limited to the specific configuration of the vertical Hall elements in FIGS. 7 to 10 (e.g. to exactly 5 contacts).

FIGS. 9 and 10 originate from finite element simulations that can be used to computationally ascertain the abovementioned functions $f_{1\text{-}40}$ as well.

Figure 11:
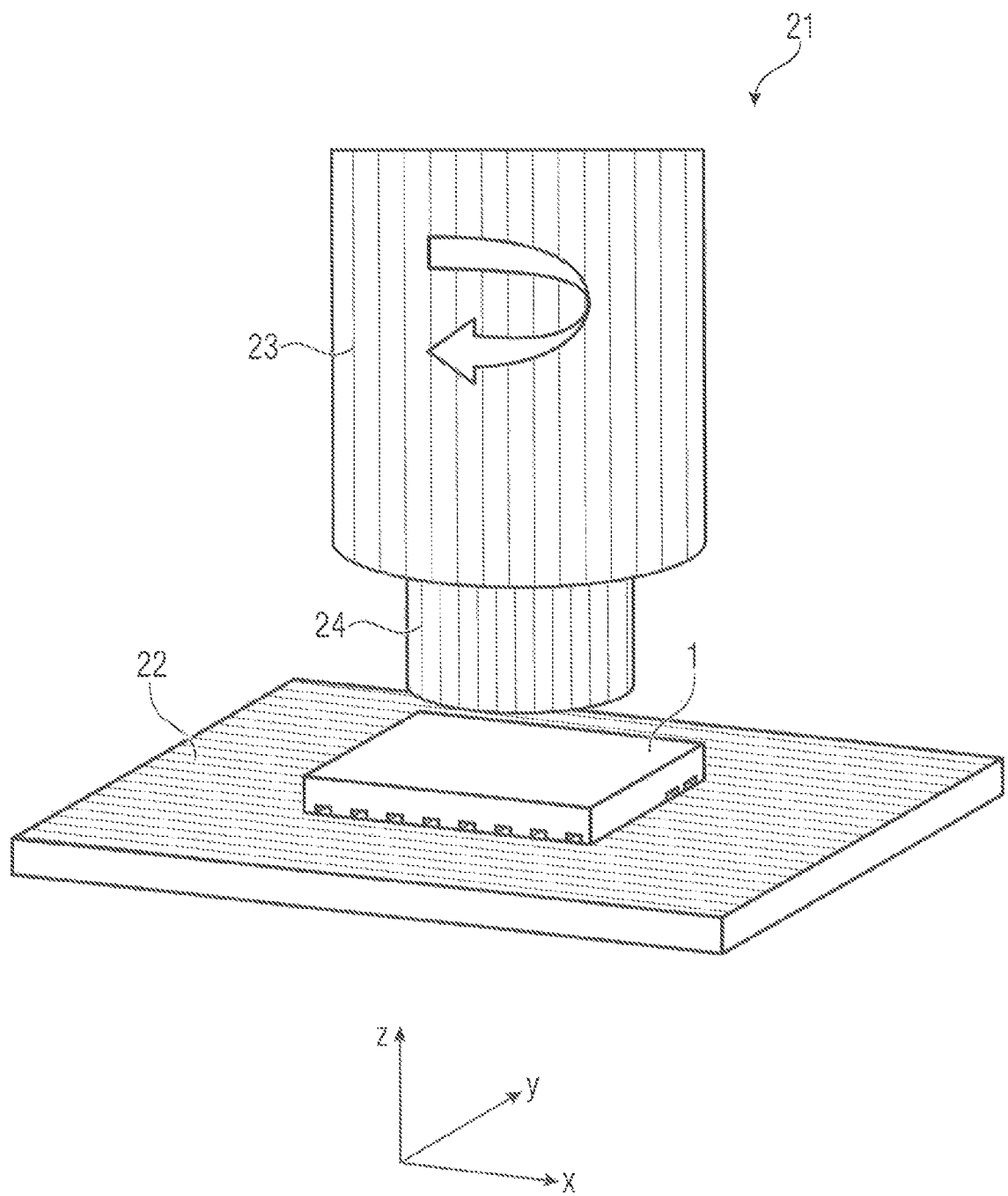
FIG. 11 shows the use of an integrated Hall sensor device for use in a magnetic angle measuring device.

FIG. 11 shows the use of an integrated Hall sensor device 1 in a magnetic angle measuring device 21.

The angle measuring device 21 comprises an integrated Hall sensor device 1 of the type described above and comprises a magnet 24 for generating the magnetic field, said magnet being rotatable about a z-axis of the coordinate system, wherein the integrated Hall sensor device 1 is configured and arranged for detecting an angular position of the magnet 24 on the basis of the angular position WIL of the magnetic field generated by the magnet 24.

In this case, the Hall sensor device 1 is arranged on a circuit board 22, for example. In this case, the magnet 24 is secured to a rotatable shaft 23 at the end side. In this case, the magnet 24 is configured and arranged such that, in the region of the integrated Hall sensor device 1, a magnetic field arises which rotates about the z-axis with the shaft 23 in a plane oriented parallel to the xy-plane.

Although specific exemplary embodiments of the invention have been illustrated and described herein, it is evident to those skilled in the art in the field of the invention that the specific exemplary embodiments illustrated and described can be replaced by a multiplicity of alternative and/or equivalent embodiments, without departing from the subject matter of the present invention. This patent application intends to cover all adaptations or variations of the specific exemplary embodiments described. Therefore, provision is made for the invention to be restricted exclusively by the subject matter of the appended claims and the equivalents thereof.

What is claimed is:

1. An integrated Hall sensor device configured to measure a magnetic field, comprising:
   a semiconductor chip oriented parallel to an xy-plane spanned by an x-axis and by a y-axis of a three-dimensional cartesian coordinate system;
   a first Hall sensor configured to generate a first magnetic field measurement signal, the first Hall sensor having a first vertical Hall element configured on the semiconductor chip in such a way that, if the first vertical Hall element is mechanically stress-free, the first magnetic field measurement signal is dependent on a first component of the magnetic field acting parallel to the x-axis and is independent of a second component of the magnetic field acting parallel to the y-axis;
   a second Hall sensor configured to generate a second magnetic field measurement signal, the second Hall sensor having a second vertical Hall element configured on the semiconductor chip in such a way that, if the second vertical Hall element is mechanically stress-free, the second magnetic field measurement signal is dependent on the second component of the magnetic field acting parallel to the y-axis and is independent of the first component of the magnetic field acting parallel to the x-axis;
   a first stress sensor configured to measure mechanical stresses in the semiconductor chip, wherein the first stress sensor is configured to generate a first shear stress measurement signal corresponding to a first shear stress acting on the first vertical Hall element, the first shear stress acting in a plane perpendicular to the x-axis and parallel to the y-axis; and
   an evaluation device configured to determine one or more properties of the magnetic field based on the first magnetic field measurement signal, the second magnetic field measurement signal, and the first shear stress measurement signal.

2. The integrated Hall sensor device as claimed in claim 1, wherein the one or more properties of the magnetic field comprise a value of the first component of the magnetic field acting in the x-direction.

3. The integrated Hall sensor device as claimed in claim 2, wherein the evaluation device is configured to determine the value of the first component of the magnetic field acting in the x-direction on a basis of a first linear combination of the first magnetic field measurement signal and the second magnetic field measurement signal,
   wherein the evaluation device is configured to determine at least one of a first coefficient of the first linear combination and a second coefficient of the first linear combination based on the first shear stress measurement signal.

4. The integrated Hall sensor device as claimed in claim 3, wherein the evaluation device is configured to determine the value of the second component of the magnetic field acting in the y-direction on a basis of a second linear combination of the first magnetic field measurement signal and the second magnetic field measurement signal,
   wherein the evaluation device is configured to determine at least one of a first coefficient of the second linear combination and a second coefficient of the second linear combination based on the first shear stress measurement signal.

5. The integrated Hall sensor device as claimed in claim 3, wherein the evaluation device is configured to determine a value of the second component of the magnetic field acting in the y-direction on a basis of a second linear combination of the first magnetic field measurement signal and the second magnetic field measurement signal,
   wherein the evaluation device is configured to determine a least one of a first coefficient of the second linear combination and a second coefficient of the second linear combination based on the first shear stress measurement signal and the second shear stress measurement signal.

6. The integrated Hall sensor device as claimed in claim 3, further comprising:
   a first normal stress sensor configured to generate a first normal stress measurement signal corresponding to a first normal stress in the semiconductor chip, the first normal stress acting in the x-direction; and
   a second normal stress sensor configured to generate a second normal stress measurement signal corresponding to a second normal stress in the semiconductor chip, the second normal stress acting in the y-direction,
   wherein the evaluation device is configured to determine at least one of the first coefficient of the first linear combination and the second coefficient of the first linear combination based on the first normal stress measurement signal and the second normal stress measurement signal.

7. The integrated Hall sensor device as claimed in claim 3, further comprising:
   a temperature sensor arranged on the semiconductor chip and configured to generate a temperature measurement signal, wherein the temperature measurement signal corresponds to a temperature of the semiconductor chip,
   wherein the evaluation device is configured to determine at least one of the first coefficient of the first linear combination and the second coefficient of the first linear combination depending on the temperature measurement signal.

8. The integrated Hall sensor device as claimed in claim 1, wherein the one or more properties of the magnetic field comprise a value of the second component acting in the y-direction.

9. The integrated Hall sensor device as claimed in claim 8, wherein the evaluation device is configured to determine the value of the second component of the magnetic field acting in the y-direction on a basis of a linear combination of the first magnetic field measurement signal and the second magnetic field measurement signal,
  wherein the evaluation device is configured to determine at least one of a first coefficient of the linear combination and a second coefficient of the linear combination based on the first shear stress measurement signal.

10. The integrated Hall sensor device as claimed in claim 9, further comprising:
  a first normal stress sensor configured to generate a first normal stress measurement signal corresponding to a first normal stress in the semiconductor chip, the first normal stress acting in the x-direction; and
  a second normal stress sensor configured to generate a second normal stress measurement signal corresponding to a second normal stress in the semiconductor chip, the second normal stress acting in the y-direction,
  wherein the evaluation device is configured to determine at least one of the first coefficient of the linear combination and the second coefficient of the linear combination depending on the first normal stress measurement signal and depending on the second normal stress measurement signal.

11. The integrated Hall sensor device as claimed in claim 9, further comprising:
  a temperature sensor arranged on the semiconductor chip and configured to generate a temperature measurement signal, wherein the temperature measurement signal corresponds to a temperature of the semiconductor chip,
  wherein the evaluation device is configured to determine at least one of the first coefficient of the linear combination and the second coefficient of the linear combination depending on the temperature measurement signal.

12. The integrated Hall sensor device as claimed in claim 1, wherein the one or more properties of the magnetic field comprise an angular position of the magnetic field in the xy-plane.

13. The integrated Hall sensor device as claimed in claim 1, further comprising:
  a second stress sensor configured to generate a second shear stress measurement signal corresponding to a second shear stress acting on the second vertical Hall element, the second shear stress acting in the plane perpendicular to the x-axis and parallel to the y-axis,
  wherein the evaluation device is configured to determine the one or more properties of the magnetic field based on the first magnetic field measurement signal, the second magnetic field measurement signal, the first shear stress measurement signal, and the second shear stress measurement signal.

14. The integrated Hall sensor device as claimed in claim 13, wherein the evaluation device is configured to determine a value of the first component of the magnetic field acting in the x-direction on a basis of a first linear combination of the first magnetic field measurement signal and the second magnetic field measurement signal,
  wherein the evaluation device is configured to determine at least one of a first coefficient of the first linear combination and a second coefficient of the first linear combination based on the first shear stress measurement signal and the second shear stress measurement signal.

15. The integrated Hall sensor device as claimed in claim 14, wherein the evaluation device is configured to determine the value of the second component of the magnetic field acting in the y-direction on a basis of a second linear combination of the first magnetic field measurement signal and the second magnetic field measurement signal,
  wherein the evaluation device is configured to determine at least one of a first coefficient of the second linear combination and a second coefficient of the second linear combination based on the first shear stress measurement signal.

16. The integrated Hall sensor device as claimed in claim 14, wherein the evaluation device is configured to determine a value of the second component of the magnetic field acting in the y-direction on a basis of a second linear combination of the first magnetic field measurement signal and the second magnetic field measurement signal,
  wherein the evaluation device is configured to determine a least one of a first coefficient of the second linear combination and a second coefficient of the second linear combination based on the first shear stress measurement signal and the second shear stress measurement signal.

17. The integrated Hall sensor device as claimed in claim 13, wherein the evaluation device is configured to determine a value of the second component of the magnetic field acting in the y-direction on a basis of a linear combination of the first magnetic field measurement signal and the second magnetic field measurement signal,
  wherein the evaluation device is configured to determine a least one of a first coefficient of the linear combination and a second coefficient of the linear combination based on the first shear stress measurement signal and the second shear stress measurement signal.

18. An angle measuring device, comprising:
  an integrated Hall sensor device, comprising:
    a semiconductor chip oriented parallel to an xy-plane spanned by an x-axis and by a y-axis of a three-dimensional cartesian coordinate system;
    a first Hall sensor configured to generate a first magnetic field measurement signal, the first Hall sensor having a first vertical Hall element configured on the semiconductor chip in such a way that, if the first vertical Hall element is mechanically stress-free, the first magnetic field measurement signal is dependent on a first component of the magnetic field acting parallel to the x-axis and is independent of a second component of the magnetic field acting parallel to the y-axis;
    a second Hall sensor configured to generate a second magnetic field measurement signal, the second Hall sensor having a second vertical Hall element configured on the semiconductor chip in such a way that, if the second vertical Hall element is mechanically stress-free, the second magnetic field measurement signal is dependent on the second component of the magnetic field acting parallel to the y-axis and is independent of the first component of the magnetic field acting parallel to the x-axis;
    a first stress sensor configured to measure mechanical stresses in the semiconductor chip, wherein the first stress sensor is configured to generate a first shear stress measurement signal corresponding to a first shear stress acting on the first vertical Hall element, the first shear stress acting in a plane perpendicular to the x-axis and parallel to the y-axis; and
  an evaluation device configured to determine an angular position of the magnetic field in the xy-plane based on the first magnetic field measurement signal, the second magnetic field measurement signal, and the first shear stress measurement signal; and a magnet configured to generate the magnetic field, the magnet being rotatable about a z-axis of the three-dimensional cartesian coordinate system, wherein the evaluation device is configured to determine an angular position of the magnet on a basis of the angular position of the magnetic field in the xy-plane generated by the magnet.

19. The method of measuring a magnetic field by an integrated Hall sensor device comprising a semiconductor chip oriented parallel to an xy-plane spanned by an x-axis and by a y-axis of a three-dimensional cartesian coordinate system, wherein the method comprises:

generating a first magnetic field measurement signal by a first Hall sensor, the first Hall sensor having a first vertical Hall element configured on the semiconductor chip in such a way that, if the first vertical Hall element is mechanically stress-free, the first magnetic field measurement signal is dependent on a first component of the magnetic field acting parallel to the x-axis and is independent of a second component of the magnetic field acting parallel to the y-axis;

generating a second magnetic field measurement signal by a second Hall sensor, the second Hall sensor having a second vertical Hall element configured on the semiconductor chip in such a way that, if the second vertical Hall element is mechanically stress-free, the second magnetic field measurement signal is dependent on the second component of the magnetic field acting parallel to the y-axis and is independent of the first component of the magnetic field acting parallel to the x-axis;

measuring mechanical stresses in the semiconductor chip by a first stress sensor, wherein the first stress sensor is configured to generate a first shear stress measurement signal corresponding to a first shear stress acting on the first vertical Hall element, the first shear stress acting in a plane perpendicular to the x-axis and parallel to the y-axis; and determining one or more properties of the magnetic field, by an evaluation device, based on the first magnetic field measurement signal, the second magnetic field measurement signal, and the first shear stress measurement signal.

\* \* \* \* \*